United States Patent [19]

Whitlock et al.

[11] Patent Number: 4,611,140
[45] Date of Patent: Sep. 9, 1986

[54] SAW-CTD PARALLEL TO SERIAL IMAGER

[75] Inventors: Robert R. Whitlock, College Park; Nicolas A. Papanicolaou, Silver Spring, both of Md.

[73] Assignee: The United States of America as represented by the Secretary of the Navy, Washington, D.C.

[21] Appl. No.: 769,099

[22] Filed: Aug. 26, 1985

[51] Int. Cl.$^4$ .............................................. H01L 41/08
[52] U.S. Cl. ............................. 310/313 B; 310/313 R; 333/159; 358/201; 358/213; 330/46
[58] Field of Search ........... 310/313 R, 313 B, 313 C, 310/322; 346/1, 158, 162; 367/7; 257/26; 365/103, 114, 118; 358/201, 213, 296; 330/4.6, 5.5; 324/111, 113, 78 E, 77 R, 77 A, 102, 109; 333/154, 193; 250/370, 395, 301; 235/181; 343/17.1, 100 CL

[56] References Cited

U.S. PATENT DOCUMENTS

| 4,334,167 | 6/1982 | Minagawa et al. | 310/313 B |
| 4,357,553 | 11/1982 | Minagawa et al. | 310/313 B |
| 4,380,864 | 4/1983 | Das | 310/313 R |
| 4,389,590 | 6/1983 | Whitlock | 310/313 R |

OTHER PUBLICATIONS

Whitlock et al. "Streak and Framing Camera Designs Using Surface Acoustic Wave Charge-Transfer Devices", Proceedings of the 16th Int'l. Congress on High Speed Photography and Photonics, Strasbourg, France, 27-31 Aug. 1984.

Primary Examiner—Mark O. Budd
Attorney, Agent, or Firm—Robert F. Beers; Sol Sheinbein; Ansel M. Schwartz

[57] ABSTRACT

A line imager comprising: a semiconductor body; a planar, transparent piezoelectric body having a main surface overlying and in proximity to the semiconductor body; wave propagation means for propagating acoustic waves on the main surface of the piezoelectric body to create traveling potential wells in the underlying semiconductor body; a traveling potential well path located in the semiconductor, the traveling potential well path beginning at the wave propogation means and extending straight away therefrom; semiconductor depletion means for depleting the semiconductor of majority charge carriers along the traveling potential well path, the depletion means located atop the piezoelectric body; a gate located on the semiconductor body and alongside and parallel to the traveling potential well path and adjoining the semiconductor depletion means; a plurality of sensor pixels for accumulating charge, the sensor pixels located in the semiconductor body, the pixels aligned next to each other and running parallel to, alongside and overlapping the gate so the integrated charge in each sensor pixel will proceed into their respective traveling potential wells when the potential across the gate is lowered, the gate having length at least equal to the length of the plurality of sensor pixels; and a dump gate located on the semiconductor and parallel to and overlapping the plurality of sensor pixels, the plurality of sensor pixels being situated between the dump gate and the gate, the dump gate causing the charge integrated in the plurality of sensor pixels to flow to ground when the potential across the dump gate is lowered, the dump gate being at least as long as the length of the plurality of sensor pixels.

11 Claims, 11 Drawing Figures

SAW-CTD PARALLEL TO SERIAL IMAGER

BACKGROUND OF THE INVENTION

The present invention relates to a system for recording electrical waveforms and more particularly to such a system employing a charge transfer device.

The high speed recording of photon images involves both mature and developing camera technologies which span the electromagnetic spectrum from infrared to x-rays, with temporal resolutions of micro- to femtoseconds. Often, the cameras, like streak cameras, are very expensive, bulky or involve precision machinery, such as rotating mirrors.

For many applications, it would be advantageous to have small, solid state imaging devices manufactured and replicated by the methods of the semiconductor circuit industry. A solid state imager necessarily includes three elements: (1) an input comprised of an array of image sensors, to transduce the incident photon energy into charge carriers in the device; (2) a charge transfer technique, to move the charges from input to an output in an organized fashion; and (3) the output, which may involve storage, display, or further processing. The arrival of alternate technologies for any of these three elements can enable the development of a new class of imagers. In particular, alternate technologies for solid state charge transfer devices (CTDs) are now available.

The first CTD, originally conceived by N. Wiener (Cybernetics, John Wiley and Sons, Inc., New York, 1948, p.144), was the Bucket Brigade Device (BBD), in which charge is stored in a serial array of capacitors and transferred by proper activation of switches placed between them. Several versions of the BBD were later developed utilizing mechanical switches, vacuum tubes, or bipolar transistors as the switching elements. The fully integrated circuit version came about in 1970, when the switches were replaced by MOS transistors. See F.L.J. Sangster, "Integrated Bucket Brigade Delay Line Using MOS Tetrodes," *Phillips* Tech. Review 31;266.

It was in 1970 when W. S. Boyle and G. E. Smith, "Charge Coupled Semiconductor Devices," *Bell* Syst. Tech. *Jour.* 49,1970, pp. 587–593, conceived and demonstrated the first Charge Coupled Device (CCD). In its original version the CCD consisted of closely spaced electrodes on an isolated surface of a semiconductor. With a proper sequence of pulses applied to these electrodes, packets of minority carriers were transferred along the surface of the semiconductor. The impact of the CCD was immense and swift. Almost immediately dozens of schemes and variations of the device were under study and many potential applications were in the making.

Charge Coupled Devices play an important role as self scanned light sensors. See C. H. Sequin, "Image Sensors Using Surface Charge Coupled Devices," in Solid State Imaging, edited by P. G. Gespers, F. Van der Wiele and M. H. White, Noordhoff-Leyden, 1976, pp. 305–329. Since silicon is a photosensitive material, charge packets may be created by a light pattern directed onto the surface of the semiconductor. These packets are transported to the output port of the CCD and read out sequentially. The CCD can also perform analog signal processing functions such as high density storage (e.g., of an image), analog delay and transversal filtering.

Initial interest in the CCD was heightened by the striking simplicity of its structure and the range of potential applications. However, as the CCD technology progressed the device performance improved on the one hand while its complexity increased on the other hand. In practical devices the electrodes are driven by multiphase clocks (up to four phases) requiring complex peripheral circuitry. Multilevel electrodes and buried channels are required to improve the efficiency and speed. For imagers, the clock busses occupy a large fraction of the available area. These drawbacks limit the speed, density and simplicity of the device.

U.S. Pat. No. 4,389,590; "System for recording waveforms using spatial dispersion", R. R. Whitlock (1983) discloses surface acoutic charge-transfer devices that allow for the recordation of electrical waveforms, be it from an electrical source or a photon source, and allows for bandwidths of greater than 1 GHZ. However, one major limitation of this device is that the transfer time across a gate is no faster than one period of the surface acoustic wave. Another major limitation is the requirement for two surface acoustic waves.

SUMMARY OF THE INVENTION

Accordingly, it is an object of the present invention to record optical images.

Another object of the present invention is to record optical images using a charge transfer device.

These and other objects of the present invention are realized by a line imager comprising a semiconductor body; a planar, transparent piezoelectric body having a main surface overlying and in proximity to the semiconductor body; wave propagation means for propagating acoustic waves on the main surface of the piezoelectric body to create traveling potential wells in the underlying semiconductor body; a traveling potential well path located in the semiconductor, the traveling potential well path beginning at the wave propogation means and extending straight array therefrom; semiconductor depletion means for depleting the semiconductor of majority charge carriers along the traveling potential well path, the depletion means located atop the piezoelectric body; a gate located on the semiconductor body and alongside and parallel to the traveling potential well path and adjoining the semiconductor depletion means; a plurality of sensor pixels for acumulating charge, the sensor pixels located in the semiconductor body, the pixels aligned next to each other and running parallel to, alongside and overlapping the gate so the integrated charge in each sensor pixel will fill the traveling potential wells when the potential across the gate is lowered, the gate having length at least equal to the length of the plurality of sensor pixels.

The advantages of this invention include its small size and economy of cost. Its ease of replacability. The potential for short integration times (high temporal resolution). A tolerence for low transfer efficiency at the gates controlling charge transfer into or out of the traveling potential well path. And, the ability for the tranfer time of charge carriers across a gate to be below one period of the SAW.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
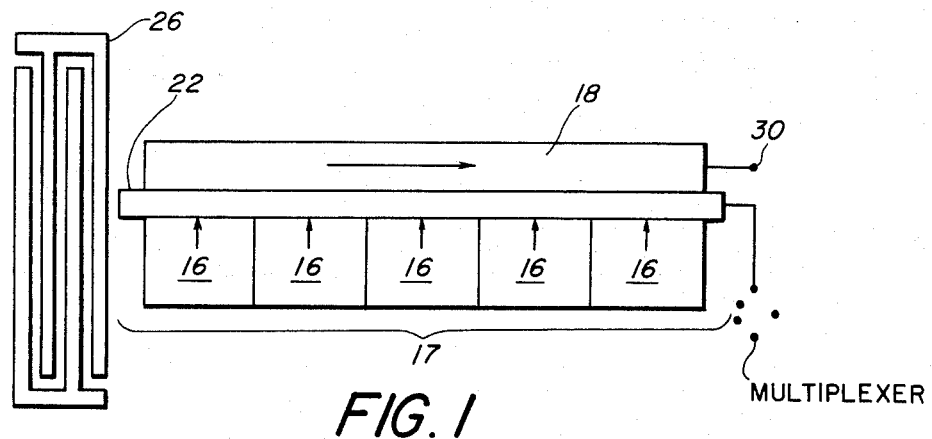
FIG. 1 is a schematic drawing of a SAW-CTD line imager.
Figure 2:
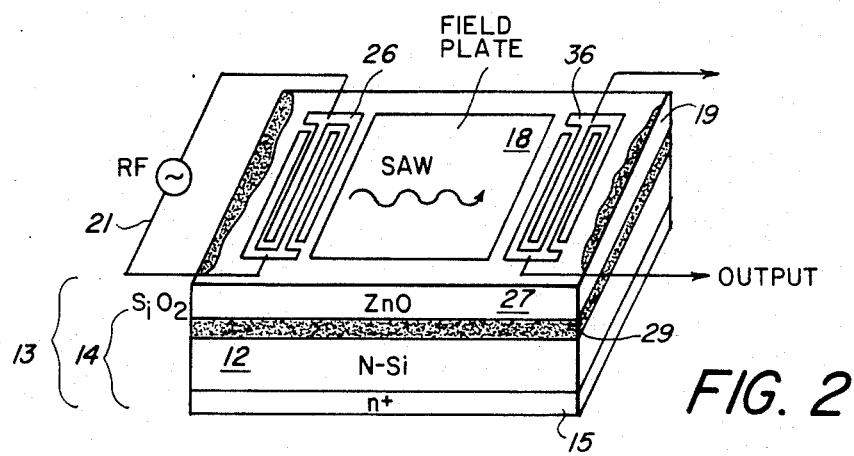
FIG. 2 is a schematic drawing of a basic SAW device that emphasizes the SAW propogation path.
Figure 3:
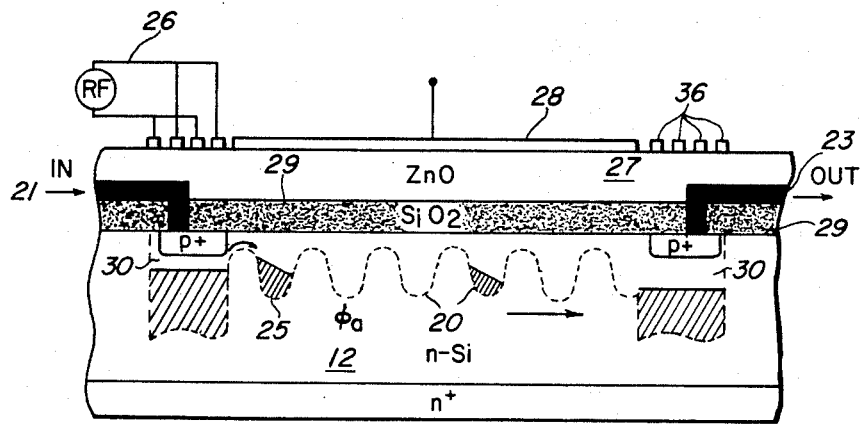
FIG. 3 is a side view schematic drawing of a basic SAW device that emphasises the SAW charge transfer function.

Referring now to the drawings, wherein like reference numerals designate identical or corresponding parts throughout the several views, and more particularly to FIGS. 1, 2 and 3 thereof, there is schematically shown a surface acoustic wave - charge transfer device (SAW-CTD) line imager 10 organized as parallel input-serial output.

A continuously powered interdigital transducer 26 sets up the SAW wells 20. Sensor pixels 16, e.g. photodiodes, produce and retain charge 25 when illuminated. After an integration time, the transfer gate 22, which separates the sensors 16 from the charge transfer (CT) zone 18, is dropped. The travelling SAW potential wells 20 are then laterally filled in parallel by conduction of the charges 25 from the sensors 16. The transfer gate 22 must be raised prior to the arrival of a SAW well 20 filled by the adjacent sensor 16, or spatial resolution will be degraded. The charges in the SAW wells are then serially transferred to the output port 30, which may be a pn junction.

More specifically, the basic structure of a Surface Acoustic Wave Charge-Transfer Device (SAW-CTD), shown in FIGS. 2 and 3 and discussed in greater detail below, is similar to a CCD structure with one difference that the electrodes and clock busses are now replaced by the surface acoustic waves. A surface acoustic wave travelling in a piezoelectric medium 27 creates electric potential wells 20 which travel with the acoustic wave and extend into the nearby semiconductor 14. Minority carriers in the semiconductor may be injected into these potential wells and transferred synchronously with the wave, i.e., with the same velocity as the wave.

FIG. 2 shows monolithic structure 13 consisting of an n+ doped contact layer 15 on the bottom surface of an n doped silicon wafer 12, a thermally grown $SiO_2$ insulating layer 29, and a sputter-coated ZnO piezoelectric film 27. The perimeter of the device is covered with acoustic absorber 19 to attenuate reflections at the boundaries. The input interdigitated aluminum contacts 26 atop the ZnO transduce rf power from an input lead into SAWs which are launched on the surface and propagate in both directions away from the input transducer 26. An identical transducer 36 may be used for output tests and diagnosis. A metal field plate 28, to which a potential is applied, is located on the ZnO 27. The field plate serves to deplete the Si of majority carriers which otherwise would recombine with the minority carriers being transported in the travelling SAW wells, and to increase the depth of the travelling potential wells in the silicon. The input and output diodes 30 are shown in FIG. 3.

FIG. 3 shows a side view of the device of FIG. 2, but here also illustrating the diodes 30 and charge transfer process. The diodes 30 are p+ regions on the surface of the n− Si substrate 12, with an electrical connection 21 for bias and signal. Since ZnO and $SiO_2$ are optically transparent, the diodes may be operated as photodiodes. The charges 25 are injected into the Si 12 at the input diode 30 and are swept up into a travelling SAW potential well 20 which, at that moment, is at the diode. The well is one of a train of potential wells (illustrated to approximate a sine wave) travelling with the acoustic speed, and transports the captured charges 25 along with it. (The wavelength of the sine wave, in the actual case, would equal the periodicity of the fingers of one phase of the two-phase transducer, and, for best temporal resolution, the diode size in the progagation direction in FIG. 3 would be no larger than the wavelength.) Wells appearing at the output diode 30 at different times contain differing amounts of charge, in accordance with the input waveform. Upon reaching the output diode 30, the charges are conducted out of the Si and along the output lead 23. The diodes 30 should be placed directly under the transducers 26,36 to obtain a delay time equal to the SAW input-output delay time; for devices used in actual applications, the diodes could both be on the same side of the input transducer.

Because of its simplicity and potential for high density and speed, the SAW-CTD concept shows promise for a variety of applications in signal procesing, memory and solid state imaging.

The first study of surface acoustic waves on a solid was done in 1885 by Lord Rayleigh, "On Waves Propagating Along the Plane Surface of an Elastic Solid," *Proc. Lon. Math.* Soc. 17, (1885–86) p.4, who investigated the case of waves at the surface of semi-infinite isotropic media. Stoneley, Geophys. Suppl. Monthly Notes Roy. Astron. Soc. 5, 1943 p. 343, extended the theory to anisotropic media and later other authors treated elastic waves in piezoelectric anisotropic semi-infinite media.

Layered media have proven to be of considerable interest with respect to piezoelectric surface acoustic waves because of the ability to derive benefits from the different materials involved. With the increasing sophistication of piezoelectric surface wave devices, the investigation of surface waves has been fully extended into the realm of anisotropic layered media. For example, various monolithic acoustoelectric and optoacoustic devices involving multilayered media have been recently developed. (Monolithic devices are structurally all one piece, as with a silicon substrate overlayered with a piezoelectric ZnO film, in distinction to "gap-coupled" or "separated media" devices in which the piezoelectric material is mechanically mounted very close to the semiconductor.) Piezoelectric overlayers are important in several applications such as filters, dispersive delay lines and guided wave structures.

Under certain crystal symmetry conditions or the assumption of weak piezoelectric coupling, the solutions describing the propagation of piezoelectric waves in a medium are decoupled into two independent modes: one set of solutions corresponding to transverse displacements called the "Love Modes," and a second set of solutions whose particle displacements are confined to the sagital plane and are referred to as "Rayleigh Modes." (The sagital plane is defined as the plane perpendicular to the surface of the structure and along the direction of propagation.)

The crystal symmetry of ZnO (hexagonal, class 6 mm crystal), a piezoelectric material 27, fulfills these conditions. The energy of the Rayleigh wave is concentrated at the surface of the medium; the particle motion and their associated potentials decay exponentially with depth, vanishing within a few SAW wavelengths of the free surface. When the wave equation solutions include exponentially dampened sinusoidal terms, the waves are called "generalized Rayleigh waves."

The most effective and commonly employed technique for the excitation of surface acoustic waves on piezoelectric media is by means of the metal interdigital transducer 26. This transducer consists of two sets of inter-leaved periodic metal electrodes deposited on the piezoelectric substrate 27 (see FIGS. 2 and 3). When an rf voltage waveform is applied across the transducer, fringing electric fields are set up between the metal fingers, inducing elastic stresses in the underlying substrate by virtue of the piezoelectric effect. These stresses propagate in the form of piezoelectric surface acoustic waves (Rayleigh waves) in both directions perpendicular to the transducer fingers. When the acoustic wave reaches an output transducer 36, as in FIG. 2, it is detected by means of the surface potential that accompanies the waves. That is, the input transducer 26 transforms electromagnetic energy to acoustic energy and the output transducer 36 converts it back to electromagnetic energy. The overall input-to-output efficiency with which these conversions occur is directly related to the electromechanical (or piezoelectric) coupling coefficient $K^2$ of the material; insertion losses (power drop resulting from inserting the device into a circuit) as low as 12db have been reported. See R. Wagers, G. Kino, P. Galle, and D. Winslow, "ZnO Acoustic Transducers Utilizing Gold Substrates," *Ultasonics* Symp. Proc. 1972, pp. 194–7.

The center to center distance d between the electrodes is equal to half the acoustic wavelength $\lambda$ and is related to the resonant angular frequency $W_o$ of the transducer and the surface acoustic wave velocity Va by the expression:

$$d = \frac{\lambda}{2} = \frac{\pi V_a}{W_o}$$

Narrow electrodes imply higher frequencies. For example, a transducer with 10 micron finger width (and the same separation) corresponds to a wavelength of 40 microns and a frequency of 100 MHz if the surface wave velocity is assumed to be $4.0 \times 10^5$ cm/sec.

Since the phase velocity of the acoustic waves is of the order of $10^5$ times slower than that of electromagnetic waves, the effect is to delay the signal by an amount equal to the acoustic transit time between the two transducers. For an acoustic wave with velocity $4.0 \times 10^5$ cm/sec and transducer separation of 1 cm the corresponding delay would be 2.5 microsec. This SAW delay line constitutes the basic structure for many surface wave devices in signal processing and solid state imaging.

The SAW-CTD may be classified as an acoustoelectric device, since like other devices belonging to this family it is based on the principle of acoustoelectric interaction with carriers in a semiconductor. Such devices include the acoustoelectric amplifier, the acoustic convolver, and acoustoelectric imagers. However, the SAW-CTD device differs from the other acoustoelectric devices in two respects. First, it is a minority charge interaction device, and secondly it is a synchronous interaction device which means that the carriers are captured and transferred with a speed equal to that of the surface acoustic wave.

The principle for the operation of the SAW-CTD, in which charged particles are accelerated to the wave velocity in a solid, is analogous to that of the Travelling Wave Linear Accelerator (linac). See L. Brillouin, "Waves and Electrons Travelling Together - A Comparison Between Travelling Wave Tubes and Linear Accelerators," *Physical Review*, 74/1, July 1948, pp. 90–93, in which charged particles are accelerated and carried along on the crest of an electromagnetic wave travelling in free space, much like the surfer who rides on a single ocean wave. The simplest structure of the linac consists of the cylindrical waveguide, in which different modes of propagation can be excited. However, for charge transfer along the axis, a longitudinal electric field is required. Although a longitudinal travelling electric wave can be produced with the TM01 mode of the waveguide, such a device is not practical for particle acceleration in free space since the phase velocity Vp of the travelling wave always exceeds that which any particle can attain, no matter what its energy. As a consequence, the travelling wave pattern will rush past the particle alternately accelerating and decelerating it, without giving it a commutative energy gain. Nevertheless, by sharply corrugating the inside walls of the waveguides, inductance is added to the equivalent network of the guide and Vp is adjusted along the axis of the waveguide. A packet of charge may then be injected into the path of the travelling wave and be accelerated along the axis of the structure.

In the operation of the SAW-CTD, the linac waveguide is now replaced by a transfer channel 18 defined on the surface of a semiconductor 14. The force needed for the acceleration and transfer of the charge is provided by a travelling acoustoelectric potential generated by a piezoelectric surface acoustic wave. The acoustic wave has a velocity slow enough to capture thermal carriers with velocities opposite to the direction of propagation (in marked contrast to the requirements of a linac). When SAWs propagate in a piezoelectric layer, they are accompanied by electric fields which extend beyond the surfaces of the layer. By placing such a piezoelectric layer over a semiconductor it is possible to generate travelling potential wells at or below the semiconductor surface. In the monolithic devices discussed below, field energy normally occupying free space can be forced below the surface and into the bulk by means of a metal field plate 28 atop the piezoelectric layer, thus strengthening the well. The simplest technique for injecting the signal charge into the travelling wells is by direct electrical injection of a p-n junction 30: injected charge is proportional to the signal applied to the input diode. See N. A. Papanicolaou, "A Monolithic Surface Acoustic Wave Charge Transfer Device," Ph.D. *Thesis, Electrical Engineering* Department, University of Maryland (1979). Another method is photoelectric injection in the silicon: charge injected into a well is a function of the incident light flux, and the device can thus be used for image sensing purposes. See R. J. Schwartz, S. D. Gaalema, R. L. Gunshor, "A surface wave interaction charged coupled device," *IEEE* 1976 *Ultrasonics Symposium,* 1976, pp. 197-200. The charges injected by the input diode are stored in these propagating wells and transferred synchronously with the wave. The delayed signal is collected a SAW transit time later at the output diode. See FIGS. 2 and 3. The field electrode 28 over the propagation region 18, in addition to enhancing the acoustoelectric potential at the silicon surface, also provides the bias for the depletion of unwanted majority charge carriers from the semiconductor surface, which is required for minority charge transfer, and prevents lateral migration of the minority charges to outside the transfer region. The interdigitated output tranducer 36, though not needed for charge transfer operations, is useful for monitoring and evaluating the surface acoustic wave.

Figure 9:
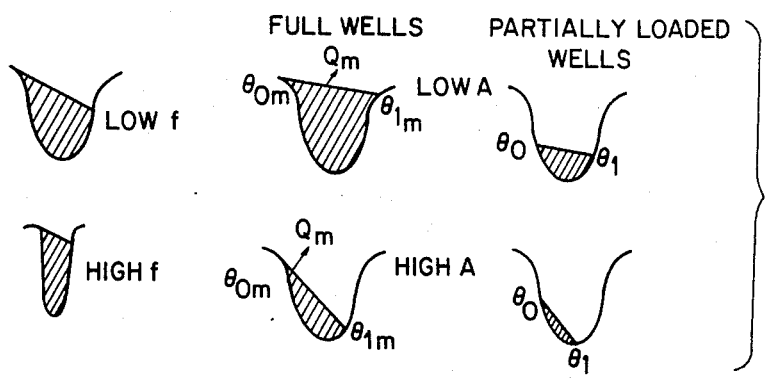
FIG. 9 is a representation of the filling of potential wells with charge carriers.

The distribution and quantity of charge carried by a SAW potential well is largely determined by the parameter A.

$$A = \frac{V_a^2}{2\pi f \, \mu_s \, \phi_o} \quad (1)$$

where $V_a$ = the acoustic speed of the SAW, $2\pi f$ = the angular frequency of the SAW, $\mu_s$ = the surface mobility of the charge carriers in the semiconductor, and $\phi_o$ = the maximum amplitude at the Si-SiO$_2$ interface of the electric potential $\phi_a$ associated with the acoustic wave. For A < 1, charge packets can be captured in the wells, and the distribution of charges in the well is as depicted in FIG. 9b. FIG. 9 shows the process of filling SAW potential wells 20. Potential wells 20 are depicted as spatial dimension (horizontal axis) versus potential (vertical axis). The filling of SAW wells 20 with charge carriers is controlled largely by the parameter A (see Equation 1). (a) High frequencies provide high fields but low charge capacities, due to the decreased size of the well. (b) Low values of A permit a greater capacity of the well without spillage of charges into an adjacent well. In the figure, phase angles with an m subscript refer to maximum charge capacity conditions. The angular relationships are:

$$\sin \theta_o = -A, \quad (2)$$

and $$\cos \theta_{1-A\theta 1} = \cos \theta_o - A\theta_o. \quad (3)$$

Further analysis yields the result that the maximum charge carrying capacity $Q_m$ of a well is given by:

$$Q_m = \frac{V_a \omega \theta_o}{2\pi f S} \left[ \sin\theta_{1m} - \sin\theta_{om} + \right. \quad (4)$$

-continued $$\left. (\theta_{om} - \theta_{1m})\cos\theta_{om} - \frac{A}{2}(\theta_{1m} - \theta_{om})^2 \right],$$

where w = the width of the well (perpendicular to SAW propagation), and S = the elastance of the structure. Since the angles are determined by A, the value of A controls the quantity in braces, which is always less than unity. For low A, near zero, the charge occupies nearly the whole well, whereas for A near but less than unity the charges only occupy the highest field portion of the well. Increasing W or $\phi_o$ increases $Q_m$, as does decreasing S. Through the value A, increasing f increases $Q_m$ (by making the electric field associated with the well stronger) and increasing $V_a$ decreases $Q_m$ (by spilling charges out of the well, e.g. when the charges are initially injected into and accelerated by the well). However, these effects of f and $V_a$ are in competition with their relationships to Qm in the leading quantity of Equation 4.

Figure 4:
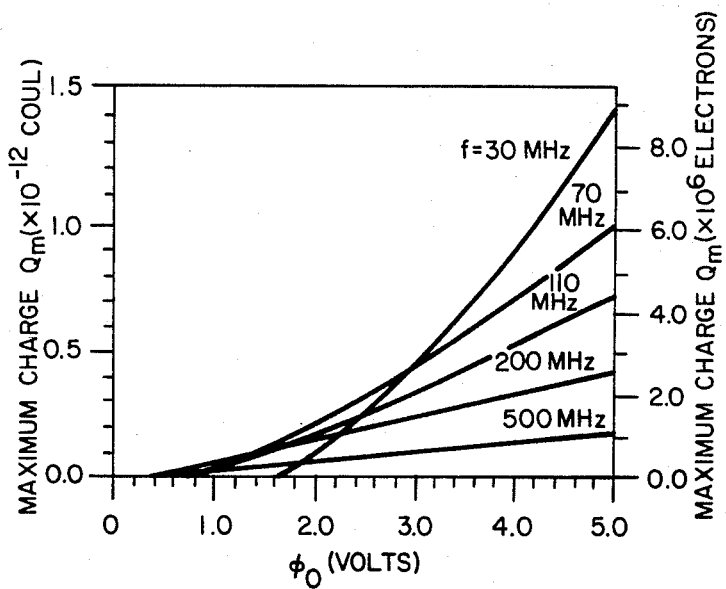
FIG. 4 a graph of the charge carrying capacity as a function of peak electric potential of SAW wells.
Figure 5:
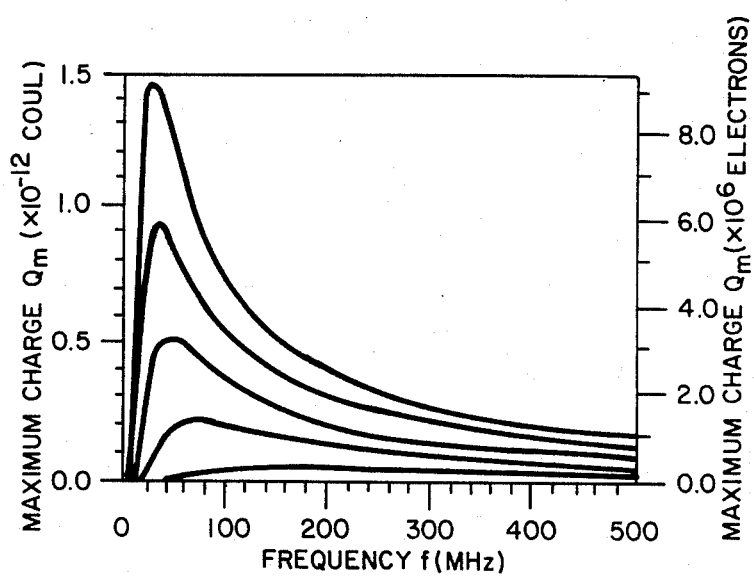
FIG. 5 is a graph of the charge carrying capacity as a function of SAW frequency, for various SAW potentials.
Figure 6:
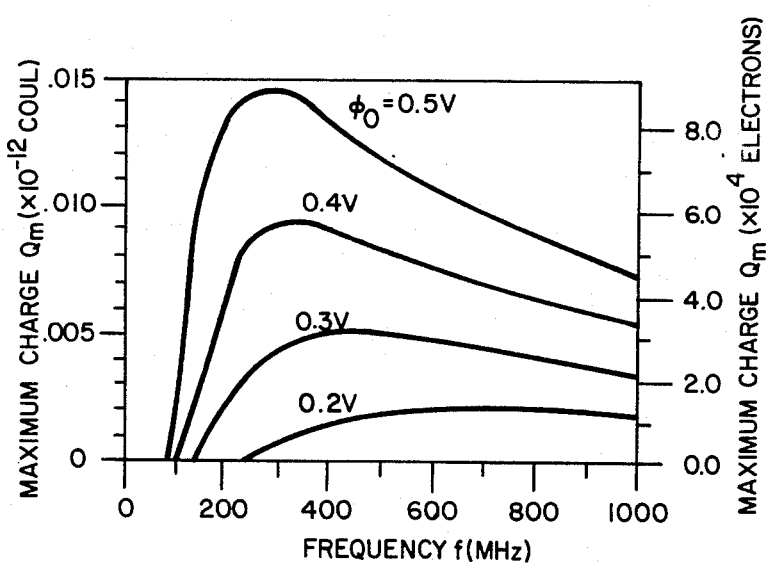
FIG. 6 is a graph of charge carrying capacity for low values of well potential.

Values of Qm were computed and are given in FIGS. 4-6 for a range of parameters, under the conditions $V_a = 4.4 \times 10^5$ cm/s, w = 20 microns, $S = 4.6 \times 10^{17}$ cm$^2$/Farad and $\mu_s = 750$ cm$^2$/V-s. The general decrease of Qm for higher frequencies can clearly be identified.

Especially noteworthy is the prediction that the order of $10^4$ electrons may be transported in a single well of width w = 20 micrometers at 1 GHz frequencies. Noise levels of under 100 electrons/pixel are achievable in solid state devices, and a signal as low as 50 electrons/pixel can render a discernible pattern. A 1 GHz device would require 1 micrometer wide fingers for the interdigitated transducer, which are technologically feasible. Higher frequencies may ulitmately be limited by acoustic diffraction, e.g. from thousand Angstrom wide grains of ZnO; other materials and device architectures may permit yet higher frequencies.

In discussing the application of solid state devices to imaging, it is convenient to set forth some of the terminology presently in use. A still camera (temporally integrating, with respect to the event of interest) is a multichannel recording device (one channel per resolvable picture element or "pixel"), while a temporally resolving camera is a type of multichannel waveform recorder. A temporally resolving camera with one dimension of spatial imaging is known as a streak camera, while two dimensions of spatial imaging with temporal resolution result in a framing camera. Framing cameras, like a movie camera, normally record the whole 2D image in integral frames, a given frame being exposed during the same interval over its entire area. Other cameras, like a scanning TV camera, record different times at different locations in the image, and may be referred to as image dissecting cameras, particularly if the event of interest is changing on a time scale comparable to or less than the time spread of one frame.

Solid state imaging devices may be built as multichannel arrays of sensing and recording elements (with a charge transfer region between the sensing elements and recording elements). While many solid state sensors have been developed, designs shall be described herein in terms of the basic structure of FIG. 2, with silicon diodes being the sensor pixels 16 or static wells 41. It is to be understood that the injector diode 16 itself may be the photon imaging sensor, or the injector diode 16 may serve as an electrical input with signal supplied by a detecting sensor located elsewhere. The output elements may also be silicon diodes, or a Metal/Oxide/-Semiconductor (MOS) capaciter (if each channel of output represents a single value).

The simplest single channel SAW-CTD is shown in FIG. 3. A photodiode or electrical charge-injection diode 16 (as the figure is drawn) injects charge into the SAW train. The charge is transferred to the output diode, which collects the charge from the SAW wells and conducts it away on the output conductor. This device has the input and output in direct line along the direction of SAW propagation. The net effect is to delay the signal between the input and output diodes by the propagation time of the SAW. Multiple channels of this device could be placed side by side to record a 1D spatial image, but such a device would be functionally equivalent to a simple line of sensor diodes, except for the charge transfer and resultant delay.

A line imager is depicted schematically in FIG. 1. In this device, a linear array of sensor pixels 16 integrates charge 25 for a controlled period of time during which the charges 25 are retained in the sensor diodes 16. Charge retention is accomplished by the presence of fixed potential barriers (not drawn) which surround each pixel 16 on three sides and a transfer gate 22 on the remaining side.

These barriers and gates 22 may be physically fabricated in different ways, (See, M. J. Howes and P. U. Morgan eds. "Charge-coupled Devices and Systems", Wiley Interscience, N.Y., 1979) all having the common characteristic that they modify the lateral potential profile in the semiconductor to prevent unwanted migration of the charges. Fixed barriers or "channel stops" may be made by increasing the doping concentration at the location of the barrier. A variable barrier, or gate 22, takes the form of an insulating layer 29 on the Si 12 and a metal electrode 28 over top, with a potential applied to the metal; the potential profile in the Si 12 is architecturally determined by the thickness of the insulator 22 (which may be fabricated to different thickness in a predetermined areal pattern), and may be varied in level according to the voltage applied to the metal electrode.

The transfer gate 22 between the sensing array 17 and the charge transfer (CT) zone 18 is dropped (by bringing the metal line forming the gate 22 to a potential approximately equal to the potential of the field plate), permitting the integrated charge 25 in the sensors 16 to migrate laterally along the SAW wells 20 and into the charge transfer region 18. In general, the sensors 16 are no larger than one SAW wavelength in the direction of SAW propagation, for highest charge capacity, and to avoid loss of spatial resolution. The speed of the gate is governed by its capacitative and inductive decay times; GHz clocking of the gate 22 can be achieved (see Howes, supra.) The transfer gate is then raised to prevent the passing SAW wells 20 from receiving charges from more than one pixel 16. In actuality, the variation in potential at the edge of the biased field plate 28 over the charge transfer zone 18 serves to laterally define the travelling SAW wells 20 and retain the charges 25. Once in the CT zone 18, the charges 25 are moved to the output diode 30 and collected. The temporal organization of the device is parallel input (sensors to SAW-CT zone) and serial output (at the end of the CT zone). In the output waveform, different times represent different pixels, i.e. different spatial locations in the sensor array. The temporal resolution for continuously cycling operation is determined by the duration between successive openings of the transfer gate 22; this duration may not be shorter than the time required for the SAW to travel the length of the sensor array 17, lest a pixel 16 be opened to an occupied SAW well. Temporal resolution may be doubled (gate cycle time halved) by adding a second transfer gate 33 and CT zone 34 below the sensors 16 in FIG. 1, (see FIG. 7) and opening the two transfer gates 26 alternately; minimum cycle time in each CT zone remains the same.

Figure 11:
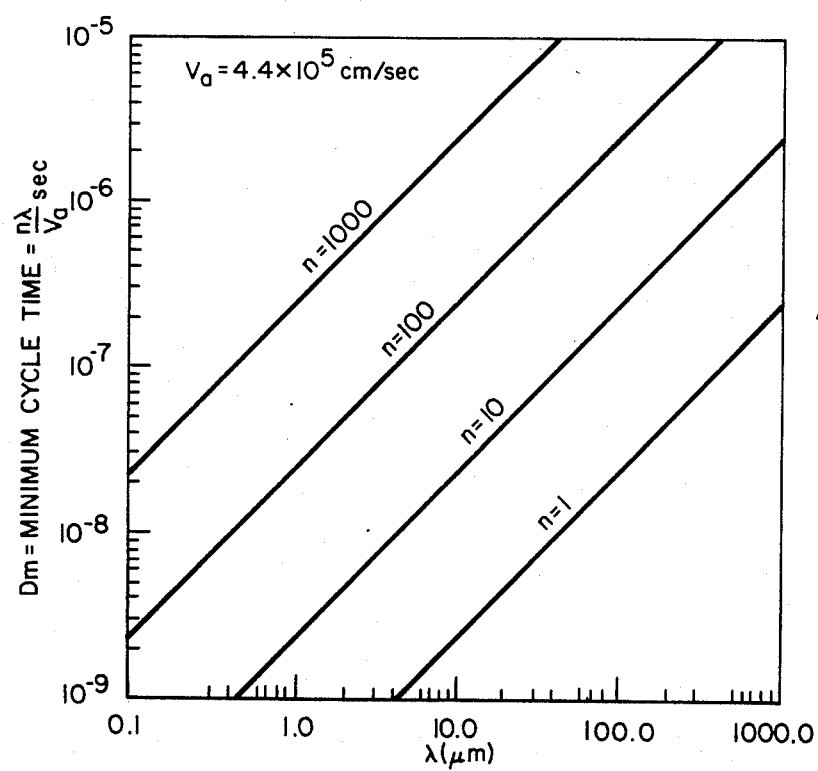
FIG. 11 is a graph of the minimum cycle time $D_m$ versus the size and number of pixels.

Minimum cycle duration $D_m$ is given in FIG. 11, as a function of n the number of pixels in the linear array, the SAW wavelength, and $v_a$ the SAW speed, for a typical value of $v_a = 4.4 \times 10^5$ cm/s in a ZnO-Si SAW-CTD. The minimum duration $D_m$ of the cycle time for a multielement SAW charge transfer zone is the transit time of the SAW train by the elements. $D_{m=n} \lambda/v_a$ where $\lambda$ is the size of the element (pixel or SAW wavelength), n is the number of elements, and $v_a$ is the speed of the acoustic wave.

Figure 7:
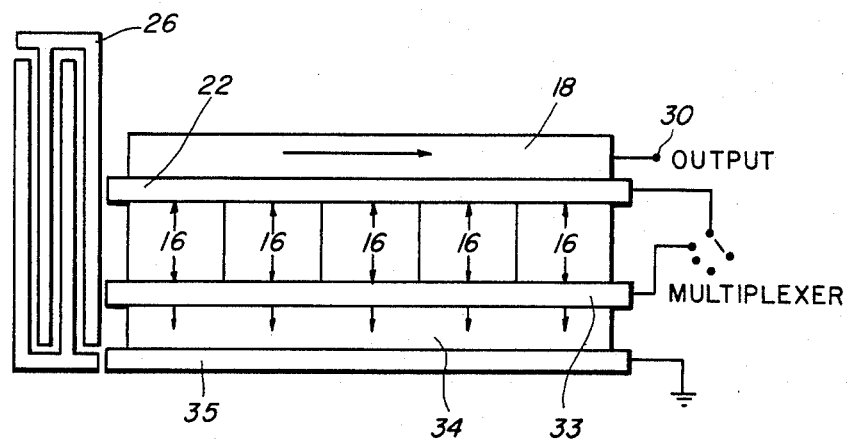
FIG. 7 is overhead schematic representation of a SAW-CTD line imager with a subcycle temporal resolution.

A direct modification can be made to the device of FIG. 1 to permit sub-cycle resolution. In FIG. 7 a second transfer gate 33 (otherwise known as a dump gate) has been added to dump charge 25 from the pixels 16 directly to ground 35. Since conduction is much faster than SAW charge transfer, the dump gate 16 may be used to quickly clear the sensors of accumulated charge and begin a new image integration. Temporal resolution is effectively the delay between the dump gate and the SAW-CT zone transfer gate. However, the constraint remains that only one SAW-CT image may be taken per $D_m$.

The line imagers of FIGS. 1 and 7 may be employed as single line elements of a two dimensional imaging array, to make up a framing camera. The technique of sub-cycle temporal resolution may also be achieved in the framing camera, but a new cycling constraint appears when successive lines of the image are serially output into a data stream. Sequentially reading the lines of the image limits the frequency with which successive frames may be taken. Shorter resolution times are obtainable by operating in the image dissecting mode: the sub-images recorded by different lines represent the event at different times.

Figure 8:
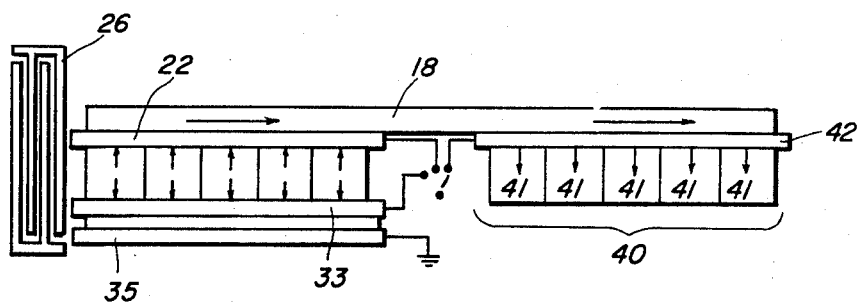
FIG. 8 is an overhead schematic representation of a one image line of a SAW-CTD frame addressed framing camera.

Whole frame operation can remove the constraint imposed on temporal resolution by line-sequencing. FIG. 8 illustrates the principle of sensing the image with an areal array 17 as discussed above, and transporting the image by SAW-CT to an image recording array 40 of static potential wells 41. These static potential wells 41 may be MOS capacitors as in a CCD, of size consistent with the SAW wavelength for best resolution. The charges 25 in the traveling SAW wells 20 are separated from the static wells 41 by a storage transfer gate 42, which is dropped at the proper time to permit the travelling charges 25 to be stored in the static wells 41. Once the image is recorded in the MOS array 40, it may be read out in a serial fashion (CCD readout). The temporal resolution of this device is set by the switching and charge transfer times at the transfer gate 22 and the dump gate 33.

The prospect of using SAW-CTDs for particle detection is not to be overlooked, whether detection is performed directly as drawn in the above figures or indirectly with detected electrical signals coming, as in FIG. 3, from particle detecting pixels located away from the SAW CT zone.

Figure 10:
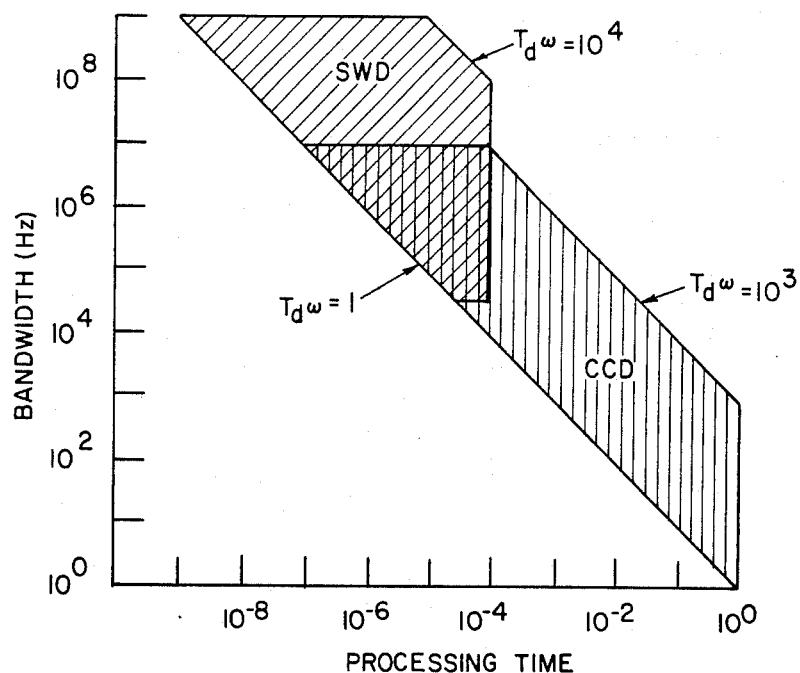
FIG. 10 is a graph comparing CCD and SAW devices as a function of processing time versus bandwidth.

The low speed of surface acoustic waves is advantageous in many applications, while also imposing some limits on practicality. For instance, the device of FIG. 1 is constrained to operating above about 10 MHz, for which a 1 cm CT zone yields but 22 wavelengths (output wells) for $V_a = 4.4 \times 10^5$ cm/s. Thus, SAW devices find application at the higher frequencies, often significantly higher than typical CCD frequencies. This is illustrated in FIG. 10 for CCDs and for SAW devices not involving charge transfer. FIG. 10 is a comparision of CCDs and Surface Wave Devices (SWDs). The application of SWDs has been to frequencies as high as 1 GHz, and CCds to lower frequencies, with considerable overlap. $T_d$ is time delay, and $T_d w$ is a time-bandwidth product. Values are approximate, for actual devices other than SAW-CTDs, and do not represent theoretical limits. The figure summarizes devices in use, but it does not represent design upper limits or portray the fastest reported SAW-CTDs or CCDs, some reaching 1 GHz or more, which are under development for non-imaging applications. Higher SAW frequencies than those shown in the figure may be attained by taking the pains necessary to obtain submicron linewidths in transducer fingers, gates, injectors, barriers, etc. For a given linewidth, higher acoustic speeds result in higher frequencies. For faster waveform recording and imaging, the higher frequencies are essential.

One of the most fundamental limits on charge transfer and speed in SAW-CTDs is the dependence of well capacity on frequency and acoustoelectric potential. The frequency dependence is given in FIGS. 4–6 for a particular device structure, and may be summarized briefly as exhibiting a definite peak in charge capacity but falling only very slowly at high frequencies, with a nearly linear dependence on potential at the higher frequencies. The maximum achievable potential is set by numerous factors, including the high power limit and design of the SAW launcher (number of fingers, frequency, capacitance, shape, piezoelectric coupling coefficient, etc.), the materials constants of the constituents (carrier mobility, permittivity, piezoelectric constants, etc.), and the architecture of the device (boundary conditions, dimensions, etc.). The requirements to operate the device in depletion, rather than accumulation or inversion, sets a materials limit on $\phi_o$; notice however that inversion layers can be swept clear of charges by a travelling SAW train. There are definite design tradeoffs to be evaluated in going to higher frequencies. For instance, at a given frequency, the potential has a maximum at a particular thickness of ZnO. A recent study of charge capacity in ZnO-Si SAW-CTDs predicts higher capacities to be achievable with the Sezawa mode of SAW propagation rather than with the lower order Rayleigh mode. Thus, a set of calculations such as given in FIGS. 4–6 may not represent the optimized attainable potential.

FIG. 4 is a graph of charge carring capacity as a function of peak electric potential of SAW wells, for a single 20 micron wide SAW well, under the conditions $v_a = 4.4 \times 10^5$ cm/s, $w = 20$ microns, $S = 4.6 \times 10^{17}$ cm$^2$/F, and $\mu_s = 750$ cm$^2$/V-s for electron carriers (hole mobility is 300 cm$^2$/V-s). Charge is given in coulombs and in number of electrons, for various SAW frequencies.

FIG. 5 is a graph of charge carrying capacity as a function of SAW frequency, for various SAW potentials. Note the existence of a peak in capacity.

FIG. 6 is a graph of charge carrying capacity for low values of well potential. Even for low potentials, GHz frequencies, and narrow wells, significant numbers of electrons may be transported in a single well originating from a single pixel.

In addition to charge capacity, charge transfer efficiency (CTE) must also be considered. The transfer of charge in the present SAW-CTD devices occurs in several different operations: charge injection from an in-line diode 16 into the SAW wells, transfer from a sensor pixel through a gate and laterally along the trough of a SAW well to fill the well, charge transport synchronously with the SAW velocity in the SAW wells (in the SAW propagation direction), charge extraction from the SAW wells by an in-line output diode 36, lateral transfer of charge along the trough of a SAW well through a transfer gate 22 and into a static well 24, and the readout of the static (CCD) wells 24. For each of these charge transfer operations there is a corresponding CTE: injection CTE, gate CTE, lateral CTE, synchronous CTE, extraction CTE, storage CTE, and CCD CTE. Some of these are discussed briefly below.

High speed charge transfer in certain types of CCDs (i.e., surface channel CCDs) is limited by inefficiencies introduced at the Si-SiO$_2$ interface by fast-acting interface states. These states act as carrier traps which hold and later release charge. The effect of interface or surface states on SAW-CTDs has been experimentally and theoretically investigated. These traps may be dealt with in three ways: by keeping them filled (the "fat zero" in CCD jargon), by avoiding them (the CCD buried channel), or perhaps by operating at speeds faster than or much slower than the states.

Firstly, it would be easy to implement the fat zero into a SAW CT zone: a diode, placed in the CT zone 18 prior to the signal injecting diode, could bleed a steady state current into the SAW wells sufficient to keep most of the interface states filled. None of the wells would be left completely empty, and zero signal level would be represented by a finite but small quantity of charge called the fat zero. The fat zero approach, however, is not a complete solution to the problem. Since the deepest portion of the well fills first, nearly empty wells (the fat zero) occupy less of the well than wells full of signal charges; thus, the dwell time of the fat zero at the traps is less than the signal. Alternatively, the CT zone 18 could be photo-illuminated at a low irradiance. Secondly, buried channels in CCDs are a micrometer or more beneath the interface. For surface acoustic waves, the acoustic potential decays exponentially to nearly zero at a depth of a few wavelengths below the top surface of the ZnO, in the absence of a field plate 28. Nonetheless, a buried channel ZnO-Si SAW-CTD may be possible to construct, since the presence of the field plate 28 above the ZnO, as in FIGS. 2 and 3, alleviates this situation dramatically by increasing the potential at the SiO$_2$-Si interface and by decreasing the rate of decay with depth. In a GaAs SAW-CTD, on the other hand, a buried channel device has been demonstrated. And thirdly, as for outrunning the traps, this is done already with the very slow traps (release times of days). The crucial quantity in question is therefor the number density of traps located in the CT channel 18 with filling and releasing rates matched to the transit time of the signal charge past the trap. Since this number is energy dependent, analyzing the situation becomes more complicated. In addition, the traps may behave as scattering centers and thereby decrease mobility. Buried channels reduce the effectiveness of the traps by transferring the charges through a spatial minimum (or at least a reduced value) in the number distribution function of traps; there is also the possibility of transferring charges through a temporal minimum or energy minimum in the number distribution of traps as a function of trapping and releasing rate and cross section. SAW-CTDs may actually be of use in measuring these quantities, since charge capacity is dependent on mobility, energy varies with impressed potential, and temporal resolution is a function of trapping and releasing rates and cross sections. As a general rule, however, note that higher frequency SAWs have shorter wavelengths, shorter travel distances for a given number of pixels, and therefore intercept fewer surface traps.

Lateral charge transfer bears similarity to CCD charge transfer. Charge transfer through an open gate in CCDs proceeds by three mechanisms, self-induced fields, fringing fields from the gate electrodes, and thermal diffusion of the charge carriers. Self-induced fields, resulting from the electrostatic repulsion of charges in the wells, is the dominant impetus when the charge density in the well is high, e.g. when the well is more than about 10% occupied. For fewer charges in the well, fringing fields and thermal diffusion, a slow process, predominate. In CCD's very high transfer efficiencies are required. For an overall efficiency of 90%, a 100-stage three-phase CCD must pass a charge packet through hundreds of gates, each having a single transfer efficiency of 99.97%. This imposes a severe frequency limitation on CCDs. Nevertheless, GaAs CCDs have reportedly achieved above 1 GHz operation.

Although the SAW-CTDs do have a fast transfer gate 22 for transferring charge carriers into or out of the CT zone, which is analogous to a CCD gate, there is only one or two such gates for image acquisition in the devices discussed here. Charge carriers remaining in the input sensors after the sensor transfer gate is raised can be removed through the dump gate. Charge carriers remaining in the CT zone after the storage transfer gate is raised are discarded and do not become a source of noise. Thus, considerable transfer inefficiency can be tolerated without smearing charges between adjacent wells. Therefore, higher gate transfer frequencies should be attainable by SAW-CTDs.

The device architectures disclosed herein may also be applied to gap-coupled devices or monolithic GaAs, where the GaAs is used in place of the monicithic structure 13.

Finally, it should be noted that electrical leads and connections run to and from the various elements of the invention but have been omitted.

Obviously, numerous (additional) modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A line imager comprising:
a semiconductor body;
a planar, transparent piezoelectric body having a main surface overlying and in proximity to the semiconductor body;
wave propagation means for propagating acoustic waves on the main surface of the piezoelectric body to create traveling potential wells in the underlying semiconductor body;
a traveling potential well path located in the semiconductor, the traveling potential well path beginning at the wave propogation means and extending straight away therefrom;
semiconductor depletion means for depleting the semiconductor of majority charge carriers along the traveling potential well path, the depletion means located atop the piezoelectric body;
a gate located on the semiconductor body and alongside and parallel to the traveling potential well path and adjoining the semiconductor depletion means;
a plurality of sensor pixels for accumulating charge, the sensor pixels located in the semiconductor body, the pixels aligned next to each other and running parallel to, alongside and overlapping the gate so the integrated charge in each sensor pixel will proceed into their respective traveling potential wells when the potential across the gate is lowered, the gate having length at least equal to the length of the plurality of sensor pixels; and
a dump gate located on the semiconductor and parallel to and overlapping the plurality of sensor pixels, the plurality of sensor pixels being situated between the dump gate and the gate, the dump gate causing the charge integrated in the plurality of sensor pixels to flow to ground when the potential across the dump gate is lowered, the dump gate being at least as long as the length of the plurality of sensor pixels.

2. A line imager as described in claim 1 which includes a storage transfer gate located on the semiconductor body and alongside and parallel to the traveling potential well path and adjoining the semiconductor depletion means,
a plurality of static wells located in the semiconductor body aligned next to each other and running parallel to, alongside and adjoining the storage transfer gate, the plurality of static wells situated downstream of the plurality of sensor pixels with regard to the traveling potential wells and beginning after the plurality of sensor pixels and the gate have ended, the storage transfer gate being at least as long as the plurality of static wells; and beginning after the gate has ended.

3. A waveform recorder as described in claim 1 wherein the semiconductor body is comprised of a planar insulating body upon which the piezoelectric body is overlying and in proximity therewith; an N doped silicon wafer underneath the planar insulating body; and an N+ doped contact layer underneath the N doped silicon;
and wherein the piezoelectric body is a sputter-coated ZnO piezoelectric film.

4. A waveform recorder as described in claim 1 wherein the wave propagation means is a metal interdigital transducer.

5. A waveform recorder as described in claim 1 wherein the sensor pixels are photodiodes.

6. A waveform recorder as described in claim 1 wherein the semiconductor depletion means is a conductive plate.

7. A waveform recorder as described in claim 2 wheein the static wells are MOS capacitors.

8. A waveform recorder as described in claim 2 wherein the gates are made of metal.

9. A line imager as described in claim 1 wherein the sensor pixels are P-N junctions, and including remote sensor pixels and electrical connections linking the remote sensor pixels to the P-N junctions, one remote sensor pixel being linked to only one P-N junction.

10. A line imager comprising:
- a semiconductor body having a planar insulating body, an N doped silicon wafer underneath the planar insulating body, and an N+doped contact layer underneath the N doped silicon;
- a planar piezoelectric body made of sputter coated ZnO having a main surface overlying and in proximity to the planar insulating body of the semiconductor body;
- a metal interdigital transducer for propagating acoustic waves on the main surface of the piezo-electric body to create traveling potential wells in the underlying semiconductor body;
- a traveling potential well path located in the semiconductor body the traveling potential well path beginning at the wave propagation means and extending straight away therefrom;
- a conducting plate for depleting the semiconductor of majority charge carriers along the traveling potential well path, the metal plate located atop the piezoelectric body;
- a gate made of metal located on the semiconductor body and alongside and parallel to the traveling potential well path and adjoining the metal plate;
- a plurality of photodiodes for accumulating charge, the photodiodes located in the semiconductor body, the photodiodes aligned next to each other and running parallel to, alongside and overlapping the gate so the intergrated charge in each photodiode will proceed into their respective traveling potential wells when the potential across the gate is lowered, the gate having length at least equal to the length of the plurality of photodiodes;
- a metal dump gate located on the semiconductor and parallel to and overlapping the plurality of photodiodes, the plurality of photodiodes being situated between the dump gate and the gate, the dump gate causing the charge integrated in the plurality of photodiodes to flow to ground when the potential across the dump gate is lowered, the dump gate being at least as long as the length of the plurality of photodiodes; and
- a plurality of MOS capacitors located in the semiconductor body aligned next to each other and running parallel to, alongside and adjoining the storage transfer gate, the plurality of static wells situated downstream of the plurality of photodiodes with regard to the traveling potential wells and beginning after the plurality of photodiodes and the gate have ended, the storage transfer gate being at least as long as the plurality of MOS capacitors and beginning after the gate has ended.

11. A method for recording optical images comprising the steps of:
- integrating charge at a series of discrete locations, the charge formed by excitations, which correspond to the image to be recorded, at the discrete locations;
- releasing the integrated charge in the series of discrete locations into traveling potential wells, each discrete location transferring charge into one traveling potential well, each traveling potential well receiving charge from only one discrete location;
- dumping charge to ground from the discrete locations so charge undersired to be integrated is removed from the discrete locations and the discrete locations are readied for another integrating step;
- transferring charge in the traveling potential wells into static wells, each static wells receiving charge from only one traveling potential well; and
- reading out the megnitude of charge in each static well.

* * * * *